United States Patent
Yang et al.

(10) Patent No.: US 11,106,296 B2
(45) Date of Patent: Aug. 31, 2021

(54) SHIFT REGISTER UNIT, DRIVING METHOD THEREOF, SCAN DRIVING CIRCUIT AND DISPLAY PANEL

(71) Applicant: BOE TECHNOLOGY GROUP CO., LTD., Beijing (CN)

(72) Inventors: Shengji Yang, Beijing (CN); Xue Dong, Beijing (CN); Jing Lv, Beijing (CN); Xiaochuan Chen, Beijing (CN); Dongni Liu, Beijing (CN); Lei Wang, Beijing (CN); Pengcheng Lu, Beijing (CN); Jie Fu, Beijing (CN); Han Yue, Beijing (CN); Li Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 565 days.

(21) Appl. No.: 16/078,061

(22) PCT Filed: Dec. 15, 2017

(86) PCT No.: PCT/CN2017/116364
§ 371 (c)(1),
(2) Date: Aug. 21, 2018

(87) PCT Pub. No.: WO2018/196400
PCT Pub. Date: Nov. 1, 2018

(65) Prior Publication Data
US 2021/0200351 A1    Jul. 1, 2021

(30) Foreign Application Priority Data
Apr. 24, 2017  (CN) .......................... 201710272199.7

(51) Int. Cl.
*G06F 3/041* (2006.01)
*G06F 3/044* (2006.01)
*G09G 3/36* (2006.01)
*G09G 3/3266* (2016.01)

(52) U.S. Cl.
CPC ............ *G06F 3/0412* (2013.01); *G06F 3/044* (2013.01); *G06F 3/04166* (2019.05); *G09G 3/3266* (2013.01); *G09G 3/3677* (2013.01); *G09G 2300/0426* (2013.01); *G09G 2310/0286* (2013.01); *G09G 2310/08* (2013.01)

(58) Field of Classification Search
CPC ............... G09G 3/3266; G09G 3/3677; G09G 2300/0426; G09G 2310/0286; G09G 2310/08; G06F 3/0412; G06F 3/04166; G06F 3/044
See application file for complete search history.

(56) References Cited

U.S. PATENT DOCUMENTS

2016/0224175 A1* 8/2016 Moon ....................... G09G 3/20
2016/0328045 A1* 11/2016 Wang .................. G09G 3/3677
2017/0102814 A1* 4/2017 Xu ........................ G06F 3/0412

* cited by examiner

Primary Examiner — Hong Zhou
(74) Attorney, Agent, or Firm — Calfee, Halter & Griswold LLP

(57) ABSTRACT

A shift register unit includes an input circuit, a first control circuit, a second control circuit, a third control circuit, a first output circuit, and a second output circuit. The first and second output circuits selectively transfer a first reference voltage from a first reference voltage terminal and a third reference voltage from a third reference voltage terminal to an output terminal of the shift register unit. This allows the shift register unit to output a desired output signal in an easy manner.

20 Claims, 9 Drawing Sheets

SHIFT REGISTER UNIT, DRIVING METHOD THEREOF, SCAN DRIVING CIRCUIT AND DISPLAY PANEL

CROSS REFERENCE TO RELATED APPLICATIONS

This application is the U.S. national phase entry of PCT/CN2017/116364, with an international filing date of Dec. 15, 2017, which claims the benefit of Chinese Patent Application No. 201710272199.7 filed on Apr. 24, 2017, the entire disclosures of which are incorporated herein by reference.

TECHNICAL FIELD

The present disclosure relates to a shift register unit, a driving method thereof, a scan driving circuit, and a display panel.

BACKGROUND

The operation of a self-capacitive touch screen is based on detection of a change in the parasitic capacitance of the touch electrode. When a finger touches the self-capacitive touch screen, the parasitic capacitance is equal to the capacitance of the touch electrode to ground plus the capacitance of the finger. The touch position of the finger can be determined by applying touch scan signals to respective touch electrodes and by detecting a change in their parasitic capacitances.

To ensure the accuracy of the detection of the change in capacitance, it may be desirable to apply the touch scan signals to the terminals of the pixel circuits in the touch screen while applying the touch scan signals to the touch electrodes during the touch sensing phase. This is because by doing this, the voltage across the terminals of the pixel circuit and the touch electrode is kept constant, thereby preventing the parasitic capacitance between these terminals and the touch electrode from affecting the accuracy of the touch detection.

Applying the touch scan signals to the terminals of the pixel circuit (e.g., a gate scan signal terminal) requires an appropriate circuit (e.g., a scan driver) that works with the pixel circuit.

SUMMARY

According to an exemplary embodiment of the present disclosure, a shift register unit is provided including: an input circuit configured to transfer an input signal from an input terminal to a first node in response to a first clock signal from a first clock signal terminal being active; a first control circuit configured to transfer a first reference voltage from a first reference voltage terminal to the first node in response to a second node being at an active potential and a second clock signal from a second clock signal terminal being active, and to transfer the first clock signal from the first clock signal terminal to the second node in response to the first node being at an active potential; a second control circuit configured to transfer a second reference voltage from a second reference voltage terminal to the second node in response to the first clock signal from the first clock signal terminal being active, and to transfer the second clock signal from the second clock signal terminal to a third node in response to the second node being at an active potential; a third control circuit configured to bring the third node into conduction with a fourth node in response to the second clock signal from the second clock signal terminal being active, and to transfer the first reference voltage from the first reference voltage terminal to the fourth node in response to the first node being at an active potential; a first output circuit configured to transfer the first reference voltage from the first reference voltage terminal to an output terminal in response to the fourth node being at an active potential; and a second output circuit configured to transfer a third reference voltage from a third reference voltage terminal to the output terminal in response to the first node being at an active potential.

In some exemplary embodiments, the input circuit includes a first transistor having a gate connected to the first clock signal terminal, a first electrode connected to the input terminal, and a second electrode connected to the first node.

In some exemplary embodiments, the first control circuit includes: a second transistor having a gate connected to the first node, a first electrode connected to the first clock signal terminal, and a second electrode connected to the second node; a third transistor having a gate connected to the second node, a first electrode connected to the first reference voltage terminal, and a second electrode; and a fourth transistor having a gate connected to the second clock signal terminal, a first electrode connected to the second electrode of the third transistor, and a second electrode connected to the first node.

In some exemplary embodiments, the second control circuit includes: a fifth transistor having a gate connected to the first clock signal terminal, a first electrode connected to the second reference voltage terminal, and a second electrode connected to the second node; a sixth transistor having a gate connected to the second node, a first electrode connected to the second clock signal terminal, and a second electrode connected to the third node; and a first capacitor connected between the second node and the third node.

In some exemplary embodiments, the third control circuit includes: a seventh transistor having a gate connected to the second clock signal terminal, a first electrode connected to the third node, and a second electrode connected to the fourth node; and an eighth transistor having a gate connected to the first node, a first electrode connected to the first reference voltage terminal, and a second electrode connected to the fourth node.

In some exemplary embodiments, the first output circuit includes: a ninth transistor having a gate connected to the fourth node, a first electrode connected to the first reference voltage terminal, and a second electrode connected to the output terminal of the shift register; and a second capacitor connected between the fourth node and the output terminal.

In some exemplary embodiments, the second output circuit includes: a tenth transistor having a gate connected to the first node, a first electrode connected to the third reference voltage terminal, and a second electrode connected to the output terminal of the shift register; and a third capacitor connected between the first node and the second clock signal terminal.

In some exemplary embodiments, the third reference voltage terminal and the second reference voltage terminal are a same signal terminal.

According to another exemplary embodiment of the present disclosure, a scan driving circuit is provided including a plurality of cascaded shift register units as described above. Except for a first one of the plurality of shift register units, the input terminal of each of the plurality of shift registers is connected to the output terminal of an adjacent preceding one of the shift register units.

According to yet another exemplary embodiment of the present disclosure, a display panel is provided including the scan driving circuit as described above.

In some exemplary embodiments, the display panel is a self-capacitive touch screen configured to alternately operate in a display phase and a touch sensing phase, and the third reference voltage terminal of each of the plurality of shift register units of the scan driving circuit is configured to receive a direct current voltage as the third reference voltage during the display phase and receive a superposition of the direct current voltage and a touch scan signal for touch electrodes of the self-capacitive touch screen during the touch sensing phase.

According to still yet another exemplary embodiment of the present disclosure, a method is provided for driving the shift register unit as described above. The shift register unit is for use by a self-capacitive touch screen configured to alternately operate in a display phase and a touch sensing phase. The method includes: in the display phase, selectively transferring, by the first and second output circuits, the first reference voltage from the first reference voltage terminal and the third reference voltage from the third reference voltage terminal to the output terminal, depending on potentials of the first node and the fourth node; and in the touch sensing phase, transferring, by the second output circuit, the third reference voltage from the third reference voltage terminal to the output terminal.

In some exemplary embodiments, the third reference voltage is a direct current voltage in the display phase.

In some exemplary embodiments, the third reference voltage is a superposition of the direct current voltage and a touch scan signal for touch electrodes of the self-capacitive touch screen in the touch sensing phase.

These and other exemplary embodiments of the present disclosure will be apparent from and elucidated with reference to the embodiment(s) described hereinafter.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

Figure 1:
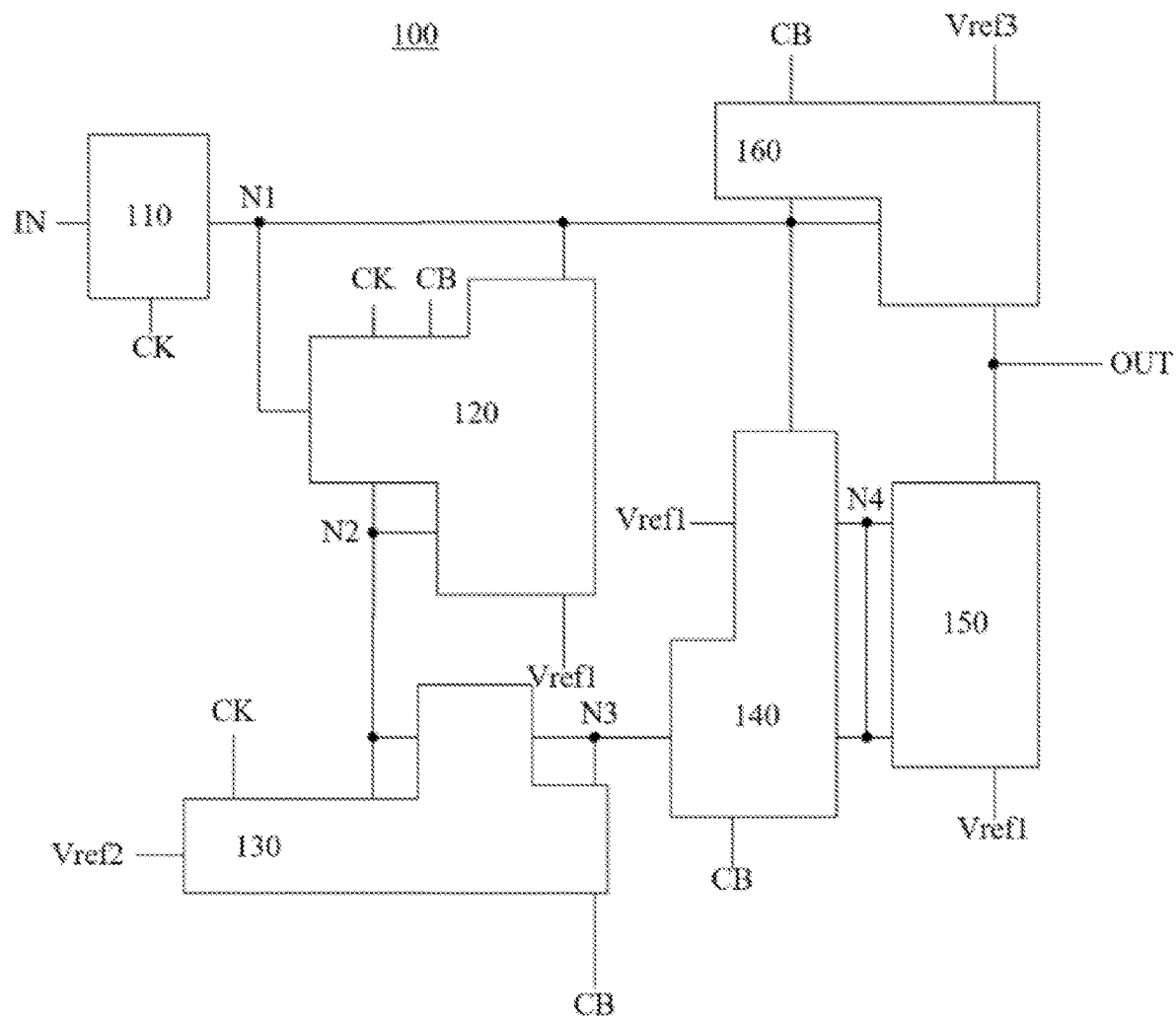
FIG. 1 is a block diagram of a shift register unit according to an embodiment of the present disclosure.

FIG. 1 is a block diagram of a shift register unit 100 according to an embodiment of the present disclosure. As shown in FIG. 1, the shift register unit 100 includes an input circuit 110, a first control circuit 120, a second control circuit 130, a third control circuit 140, a first output circuit 150, and a second output circuit 160.

The input circuit 110 is configured to transfer an input signal from an input terminal IN to a first node N1 in response to a first clock signal from a first clock signal terminal CK being active.

The first control circuit 120 is configured to transfer a first reference voltage from a first reference voltage terminal Vref1 to the first node N1 in response to a second node N2 being at an active potential and a second clock signal from a second clock signal terminal CB being active. The first control circuit 120 is further configured to transfer the first clock signal from the first clock signal terminal CK to the second node N2 in response to the first node N1 being at an active potential.

The second control circuit 130 is configured to transfer a second reference voltage from a second reference voltage terminal Vref2 to the second node N2 in response to the first clock signal from the first clock signal terminal CK being active. The second control circuit 130 is further configured to transfer the second clock signal from the second clock signal terminal CB to a third node N3 in response to the second node N2 being at an active potential.

The third control circuit 140 is configured to bring the third node N3 into conduction with the fourth node N4 in response to the second clock signal from the second clock signal terminal CB being active. The third control circuit 140 is further configured to transfer the first reference voltage from the first reference voltage terminal Vref1 to a fourth node N4 in response to the first node N1 being at an active potential.

The first output circuit 150 is configured to transfer the first reference voltage from the first reference voltage terminal Vref1 to an output terminal OUT in response to the fourth node N4 being at an active potential.

The second output circuit 160 is configured to transfer a third reference voltage from a third reference voltage terminal Vref3 to the output terminal OUT in response to the first node N1 being at an active potential.

As used herein, the term "active potential" refers to a potential at which a circuit element (e.g., a transistor) involved is enabled. In contrast, the term "inactive potential" refers to a potential at which the circuit element involved is disabled. Correspondingly, the phrase "signal being active" means that the signal has an active potential. For an N-type transistor, the active potential is high and the inactive potential is low. For a P-type transistor, the active potential is low, and the inactive potential is high.

As will be described later, the first and second output circuits 150 and 160 selectively transfer the first reference voltage from the first reference voltage terminal Vref1 and the third reference voltage from the third reference voltage terminal Vref3 to the output terminal OUT depending upon the potentials of the first node and the fourth node. This allows the shift register unit 100 to output a desired output signal in an easy manner. Specifically, the desired output signal may be generated by superposing a desired signal (for example, a touch scan signal) at the first reference voltage terminal Vref1 and the third reference voltage terminal Vref3 without affecting the operation of the internal circuit elements of the shift register unit 100.

Figure 2:
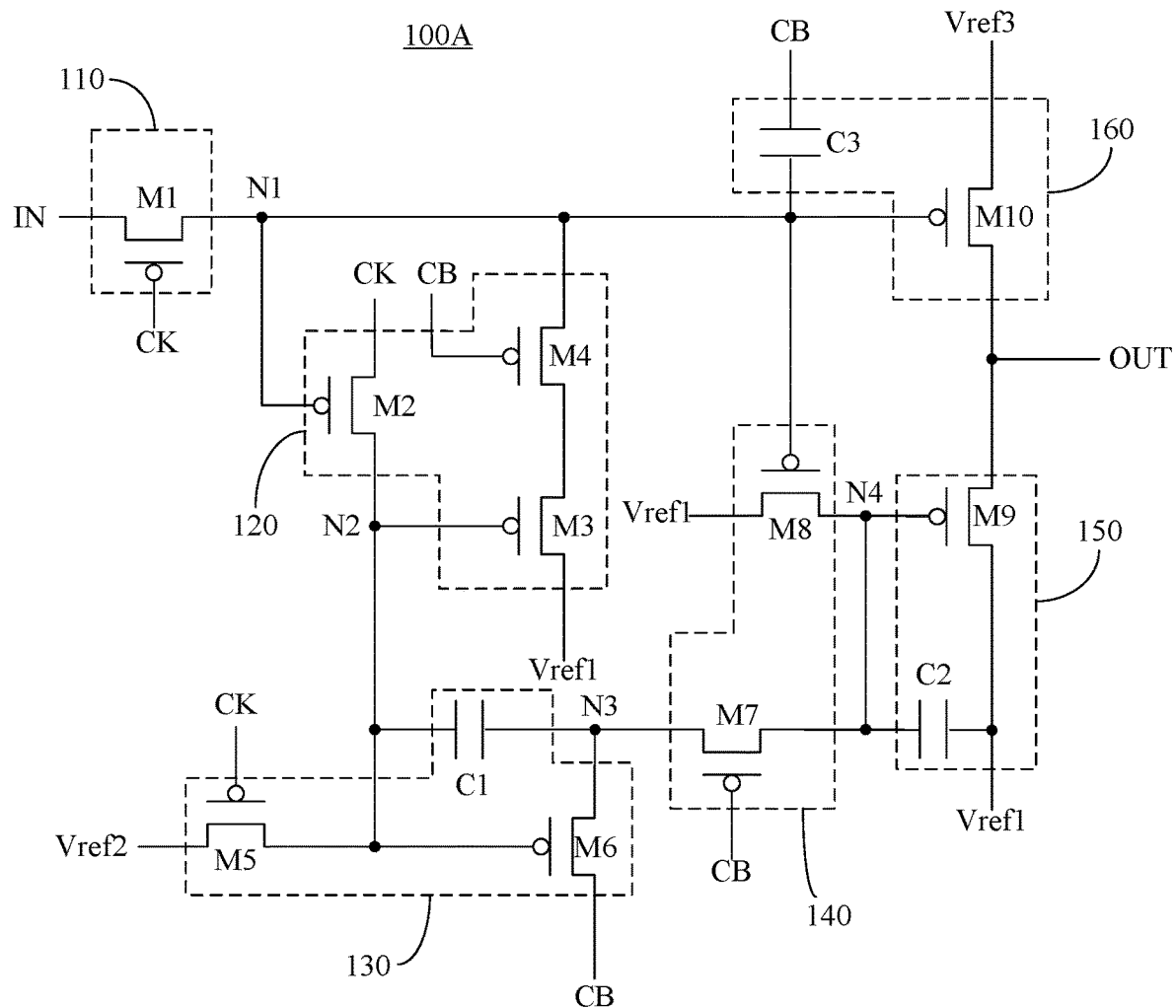
FIG. 2 is a circuit diagram of an example circuit of the shift register unit shown in FIG. 1.

FIG. 2 is a circuit diagram of an example circuit 100A of the shift register unit 100 shown in FIG. 1. The configuration of the shift register unit 100 of FIG. 1 is described below with reference to the example circuit 100A of FIG. 2.

The input circuit 110 includes a first transistor M1. The first transistor M1 has a gate connected to the first clock signal terminal CK, a first electrode connected to the input terminal IN, and a second electrode connected to the first node N1.

The first control circuit 120 includes a second transistor M2, a third transistor M3, and a fourth transistor M4. The second transistor M2 has a gate connected to the first node N1, a first electrode connected to the first clock signal terminal CK, and a second electrode connected to the second node N2. The third transistor M3 has a gate connected to the second node N2, a first electrode connected to the first reference voltage terminal Vref1, and a second electrode. The fourth transistor M4 has a gate connected to the second clock signal terminal CB, a first electrode connected to the second electrode of the third transistor M3, and a second electrode connected to the first node N1.

The second control circuit 130 includes a fifth transistor M5, a sixth transistor M6, and a first capacitor C1. The fifth transistor M5 has a gate connected to the first clock signal terminal CK, a first electrode connected to the second reference voltage terminal Vref2, and a second electrode connected to the second node N2. The sixth transistor M6 has a gate connected to the second node N2, a first electrode connected to the second clock signal terminal CB, and a second electrode connected to the third node N3. The first capacitor C1 is connected between the second node N2 and the third node N3.

The third control circuit 140 includes a seventh transistor M7 and an eighth transistor M8. The seventh transistor M7 has a gate connected to the second clock signal terminal CB, a first electrode connected to the third node N3, and a second electrode connected to the fourth node N4. The eighth transistor M8 has a gate connected to the first node N1, a first electrode connected to the first reference voltage terminal Vref1, and a second electrode connected to the fourth node N4.

The first output circuit 150 includes a ninth transistor M9 and a second capacitor C2. The ninth transistor M9 has a gate connected to the fourth node N4, a first electrode connected to the first reference voltage terminal Vref1, and a second electrode connected to the output terminal OUT of the shift register. The second capacitor C2 is connected between the fourth node N4 and the output terminal OUT of the shift register.

The second output circuit 160 includes a tenth transistor M10 and a third capacitor C3. The tenth transistor M10 has a gate connected to the first node N1, a first electrode connected to the third reference voltage terminal Vref3, and a second electrode connected to the output terminal OUT of the shift register. The third capacitor C3 is connected between the first node N1 and the second clock signal terminal CB.

In the example circuit 100A of FIG. 2, all the transistors are illustrated and described as P-type transistors. In this case, the first reference voltage terminal Vref1 is at a high potential, and the second reference voltage terminal Vref2 and the third reference voltage terminal Vref3 are at a low potential.

Figure 3:
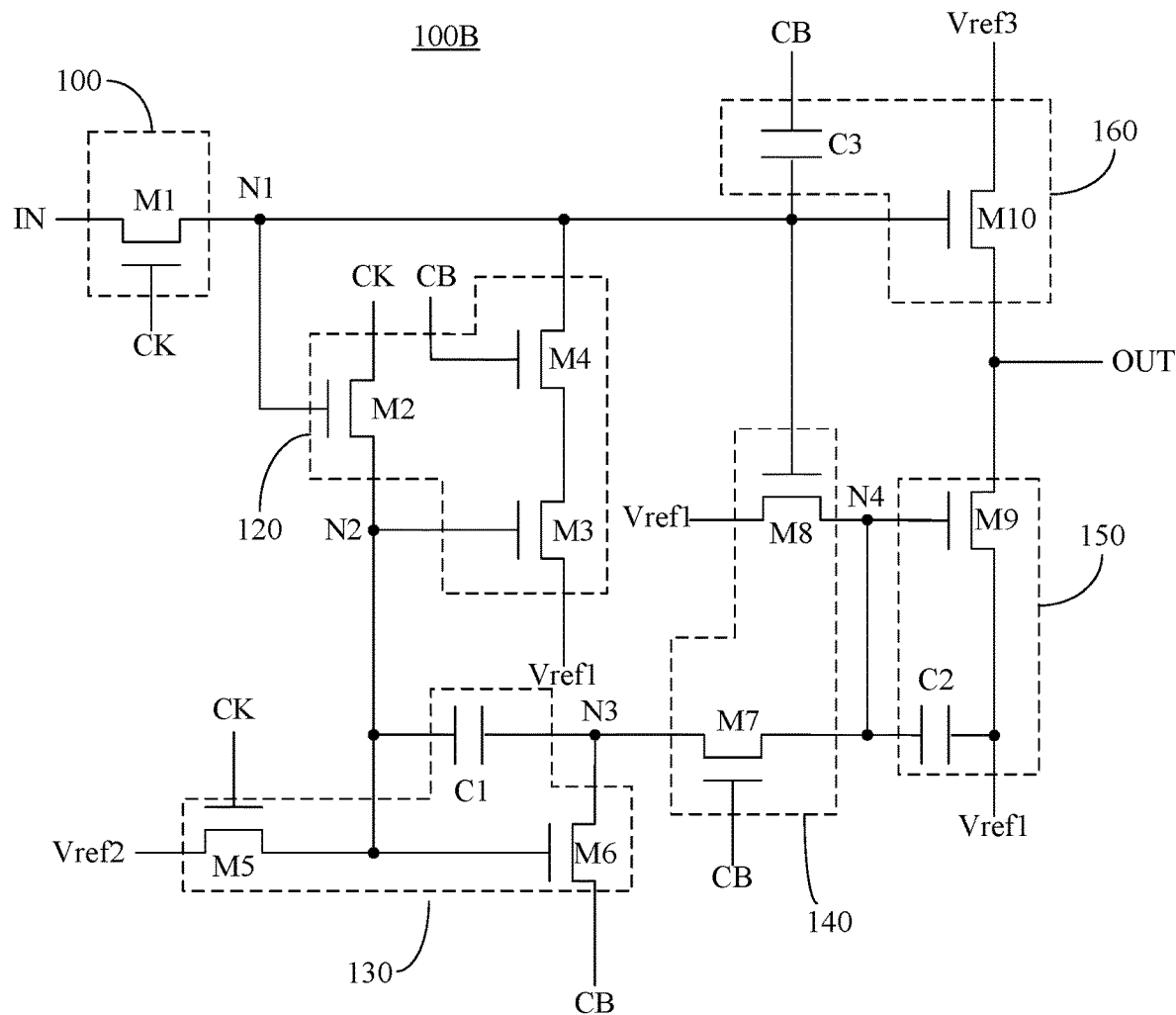
FIG. 3 is a circuit diagram of another example circuit of the shift register unit shown in FIG. 1.

FIG. 3 is a circuit diagram of another example circuit 100B of the shift register unit 100 shown in FIG. 1. The configuration of the example circuit 100B is similar to the configuration of the example circuit 100A except that all the transistors are N-type transistors, and thus detailed description thereof is omitted here.

In the example circuit 100B of FIG. 3, the first reference voltage terminal Vref1 is at a low potential, and the second reference voltage terminal Vref2 and the third reference voltage terminal Vref3 are at a high potential.

In embodiments, the third reference voltage terminal Vref3 and the second reference voltage terminal Vref2 may be the same signal terminal, thereby simplifying the circuit connection.

In embodiments, each of the transistors may, for example, be a thin film transistor which is typically fabricated such that its first electrode (e.g., source) and second electrode (e.g., drain) can be used interchangeably.

Figure 4A:
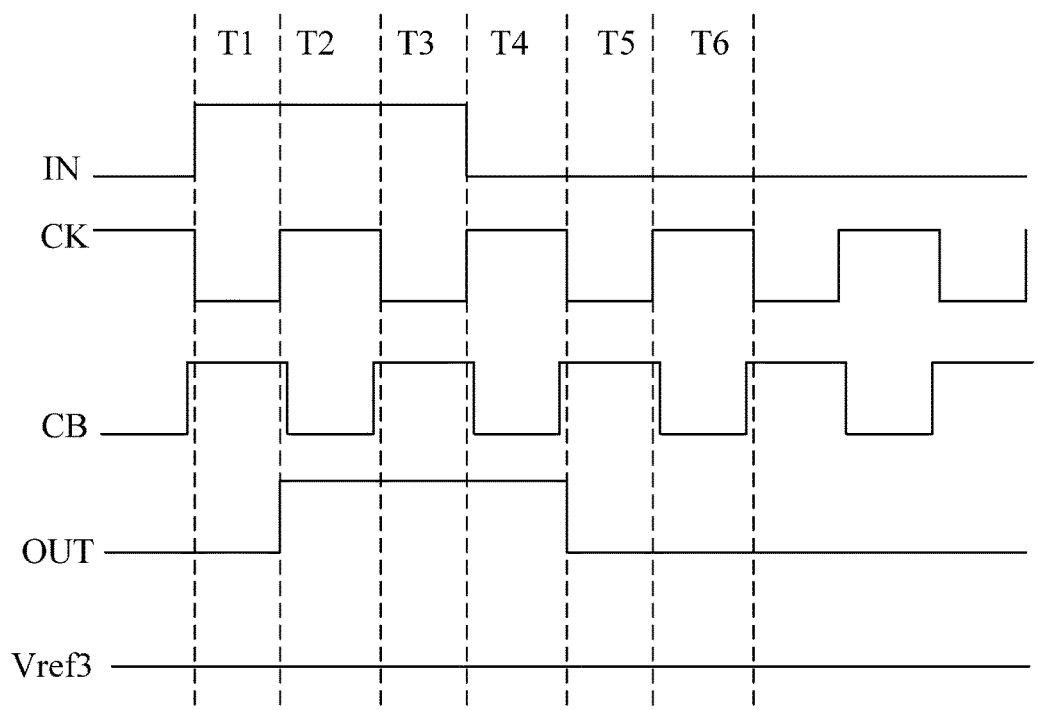
FIG. 4A is an example timing diagram for the shift register unit shown in FIG. 2.

FIG. 4A is an example timing diagram for the shift register unit 100A shown in FIG. 2. The operation of the shift register unit 100A is described below in conjunction with FIG. 4A. As previously described, the first reference voltage terminal Vref1 is at a high potential, and the second reference voltage terminal Vref2 and the third reference voltage terminal Vref3 are at a low potential. In the following, the high potential is represented by 1 and the low potential is represented by 0.

In phase T1, IN=1, CK=0, and CB=1.

Since CK=, the first transistor M1 and the fifth transistor M5 are turned on, the first node N1 is at a high potential, and the second transistor M2 is turned off. Since the second reference voltage terminal Vref2 is at a low potential and the fifth transistor M5 is turned on, the second node N2 is at a low potential such that the sixth transistor M6 and the third transistor M3 are turned on. Since the sixth transistor M6 is turned on and CB=1, the third node N3 is at a high potential. Since the second node N2 is at a low potential and the third node N3 is at a high potential, the first capacitor C1 is charged. Since CB=1, the fourth transistor M4 and the seventh transistor M7 are turned off. Since the first node N1 is at a high potential, the tenth transistor M10 and the eighth transistor M8 are turned off, and the fourth node N4 is in a floating state. Due to the holding effect of the second capacitor C2, the fourth node N4 remains at a high potential as in a previous cycle. Since the fourth node N4 is at a high potential, the ninth transistor M9 is turned off. The output terminal OUT remains at a low potential as in the previous cycle.

In phase T2, IN=1, CK=1, and CB=0.

Since CK=1, the first transistor M1 and the fifth transistor M5 are turned off, the second node N2 remains at a low potential, and the sixth transistor M6 is turned on.

Since CB=, the third node N3 becomes at a low potential. Since the second node N2 is in the floating state, the self-boosting effect of the first capacitor C1 causes the potential of the second node N2 to be further pulled down, and thus the third transistor M3 remains turned on. With CB=, the fourth transistor M4 and the seventh transistor M7 are turned on. Since the first reference voltage terminal Vref1 is at a high potential, the first node N1 remains at a high potential. Since the first node N1 is at a high potential and CB=, the third capacitor C3 is charged, and the eighth transistor M8 and the tenth transistor M10 are turned off. As the seventh transistor M7 is turned on, the fourth node N4 becomes at a low potential. Since the fourth node N4 is at a low potential and the first reference voltage terminal Vref1 is at a high potential, the second capacitor C2 is charged. Since the fourth node N4 is at a low potential, the ninth transistor M9 is turned on. The high potential voltage from the first reference voltage terminal Vref1 is transferred to the output terminal OUT through the ninth transistor M9, making the output terminal OUT become at a high potential.

In phase T3, IN=1, CK=0, and CB=1.

Since CK=, the first transistor M1 and the fifth transistor M5 are turned on, the first node N1 is at a high potential, and the second transistor M2 is turned off. Since the second reference voltage terminal Vref2 is at a low potential and the fifth transistor M5 is turned on, the second node N2 remains at a low potential, the sixth transistor M6 and the third transistor M3 are turned on, and the third node N3 is at a high potential. Since the second node N2 is at a low potential and the third node N3 is at a high potential, the first capacitor C1 is charged. Since CB=1, the fourth transistor M4 and the seventh transistor M7 are turned off. Since the first node N1 is at a high potential, the tenth transistor M10 and the eighth transistor M8 are turned off, and the fourth node N4 is in a floating state. Due to the holding effect of the second capacitor C2, the fourth node N4 remains at a low potential as in phase T3, so that the ninth transistor M9 is turned on. The high potential voltage from the first reference voltage terminal Vref1 is transferred to the output terminal OUT through the ninth transistor M9, rendering the output terminal OUT still at a high potential.

In phase T4, IN=0, CK=1, and CB=0.

Since CK=1, the first transistor M1 and the fifth transistor M5 are turned off, the second node N2 is still at a low potential, and the sixth transistor M6 is turned on.

Since CB=, the potential of the third node N3 changes from high to low. Since the second node N2 is in the floating state, the self-boosting effect of the first capacitor C1 causes the potential of the second node N2 to be further pulled down, and thus the third transistor M3 remains turned on. Since CB=, the fourth transistor M4 and the seventh transistor M7 are turned on, and the first node N1 is still at a high potential. Since the first node N1 is at a high potential and CB=0, the third capacitor C3 is charged. Since the first node N1 is at a high potential, the tenth transistor M10 is turned off. As the seventh transistor M7 is turned on, the fourth node N4 becomes at a low potential, and the ninth transistor M9 is turned on. Since the fourth node N4 is at a low potential and the first reference voltage terminal Vref1 is at a high potential, the second capacitor C2 is charged. The high potential voltage from the first reference voltage terminal Vref1 is transferred to the output terminal OUT through the ninth transistor M9, rendering the output terminal OUT still at a high potential.

In phase T5, IN=0, CK=, CB=1.

Since CK=, the first transistor M1 and the fifth transistor M5 are turned on, the first node N1 becomes at a low potential, and the second transistor M2 is turned on. The second node N2 is at a low potential so that the sixth transistor M6 and the third transistor M3 are turned on, and the third node N3 is at a high potential. Since the third node N3 is at a high potential and the second node N2 is at a low potential, the first capacitor C1 is charged. Since CB=1 and the first node N1 is at a low potential, the third capacitor C3 is charged. Since CB=1, the fourth transistor M4 and the seventh transistor M7 are turned off. Since the first node N1 is at a low potential, the tenth transistor M10 and the eighth transistor M8 are turned on so that the fourth node N4 is at a high potential, and the ninth transistor M9 is turned off. The low potential voltage from the third reference voltage terminal Vref3 is transferred to the output terminal OUT through the tenth transistor M10, making the output terminal OUT become at a low potential.

In phase T6, IN=0, CK=1, and CB=0.

Since CK=1, the first transistor M1 and the fifth transistor M5 are turned off, the first node N1 is still at a low potential, and the second transistor M2 is turned on. The second node N2 becomes at a high potential, so that the third transistor M3 and the sixth transistor M6 are turned off, and the first node N1 is in a floating state. Since CB is changed from being at the high potential in phase T5 to being at a low potential, the self-boosting effect of the third capacitor C3 causes the potential of the first node N1 to be further pulled down, and thus the eighth transistor M8 and the tenth transistor M10 are turned on. The fourth node N4 is at a high potential, and the ninth transistor M9 is turned off. Since CB=0, the fourth transistor M4 and the seventh transistor M7 are turned on, and the third node N3 is still at a high potential. The low potential voltage from the third reference voltage terminal Vref3 is transferred to the output terminal OUT through the tenth transistor M10, rendering the output terminal OUT still at a low potential.

The operation of phase T5 and phase T6 is thereafter repeated until the next input signal (high active pulse) is applied to the input terminal IN.

Figure 4B:
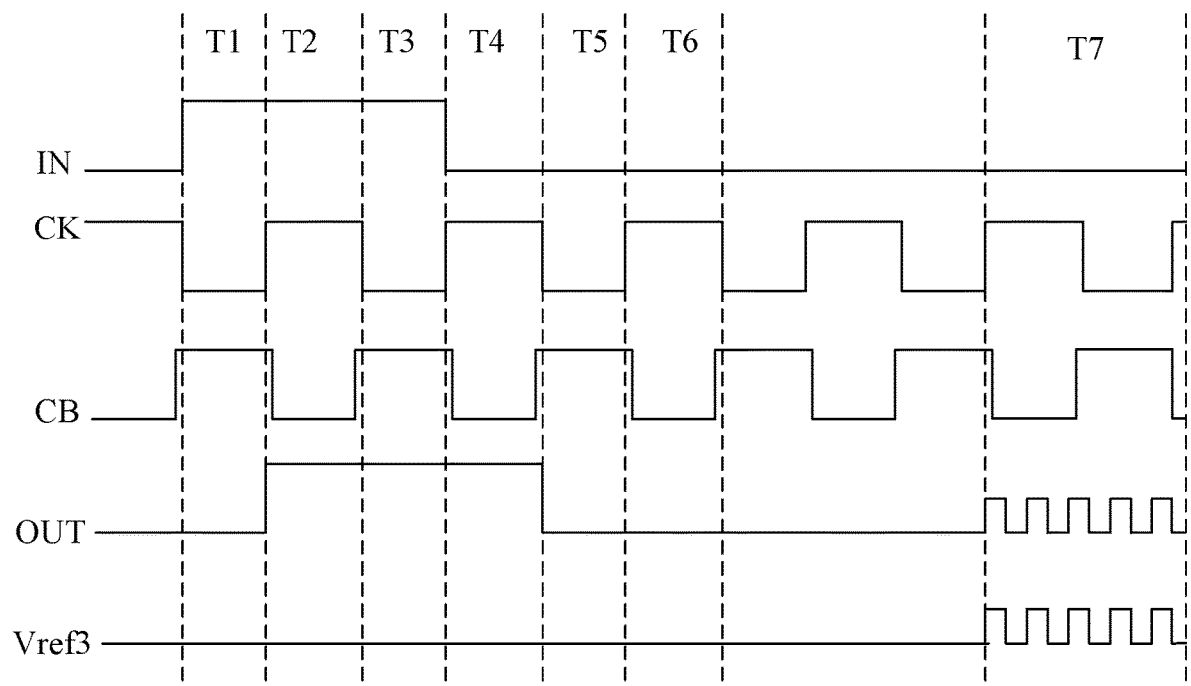
FIG. 4B is an example timing diagram for the shift register unit shown in FIG. 2 in a touch screen scenario.

FIG. 4B is an example timing diagram for the shift register unit 100A shown in FIG. 2 in a touch screen scenario. The touch screen alternately operates in a display phase and a touch sensing phase, and the shift register unit 100A can supply a gate scan signal for pixel circuits in the touch screen. In the display phase (e.g., phases T1-T6), the third reference voltage terminal Vref3 is applied with a direct current (DC) voltage (a low potential voltage in this example). In the touch sensing phase (phase T7), the third reference voltage terminal Vref3 is additionally applied with a touch scan signal (a square wave signal in this example). The signal from the third reference voltage terminal Vref3 (i.e., the superposition of the low potential voltage and the touch scan signal) is transferred to the output terminal OUT through the tenth transistor M10 so that the gate scan signal supplied to the pixel circuits is also superposed with the touch scan signal.

In the example of FIG. 4B, the signal applied to the third reference voltage terminal Vref3 is, for example, a DC voltage $V_0$ during phases T1-T6, and is, for example, a superposition of the DC voltage $V_0$ and a square wave signal having an amplitude of 5 Volts during phase T7.

Figure 5A:
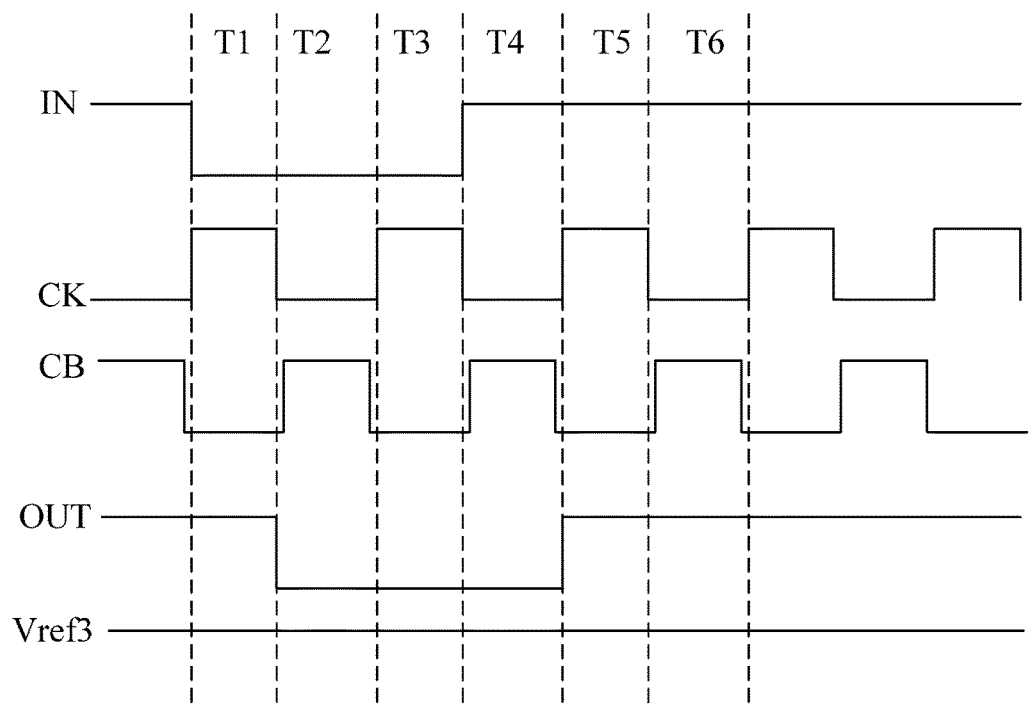
FIG. 5A is an example timing diagram for the shift register unit shown in FIG. 3.

FIG. 5A is an example timing diagram for the shift register unit 100B shown in FIG. 3. The operation of the shift register unit 100B is described below in conjunction with FIG. 5A. As previously described, the first reference voltage terminal Vref1 is at a low potential, and the second reference voltage terminal Vref2 and the third reference voltage terminal Vref3 are at a high potential. In the following, the high potential is represented by 1 and the low potential is represented by 0.

In phase T1, IN=0, CK=1, and CB=0.

Since CK=1, the first transistor M1 and the fifth transistor M5 are turned on, the first node N1 is at a low potential, and the second transistor M2 is turned off. Since the second reference voltage terminal Vref2 is at a high potential and the fifth transistor M5 is turned on, the second node N2 is at a high potential, and the sixth transistor M6 and the third transistor M3 are turned on. Since the sixth transistor M6 is turned on and CB=, the third node N3 is at a low potential. Since the second node N2 is at a high potential and the third node N3 is at a low potential, the first capacitor C1 is charged. With CB=0, the fourth transistor M4 and the seventh transistor M7 are turned off. Since the first node N1 is at a low potential, the tenth transistor M10 and the eighth transistor M8 are turned off, and the fourth node N4 is in a floating state. Due to the holding effect of the second capacitor C2, the fourth node N4 remains at a low potential as in a previous cycle. Since the fourth node N4 is at a low potential, the ninth transistor M9 is turned off, and the output terminal OUT remains at a high potential as in the previous cycle.

In phase T2, IN=, CK=, and CB=1.

Since CK=, the first transistor M1 and the fifth transistor M5 are turned off, the second node N2 remains at the high level, and the sixth transistor M6 is turned on. Since CB=1, the third node N3 becomes at a high potential. Since the second node N2 is in the floating state, the self-boosting effect of the first capacitor C1 causes the potential of the second node N2 to be pulled higher further, and thus the third transistor M3 remains turned on. With CB=1, the fourth transistor M4 and the seventh transistor M7 are turned on. Since the first reference voltage terminal Vref1 is at a low potential, the potential of the first node N1 is still low. Since the first node N1 is at a low potential and CB=1, the third capacitor C3 is charged, and the eighth transistor M8 and the tenth transistor M10 are turned off. Since the seventh transistor M7 is turned on, the fourth node N4 becomes at a high potential. Since the fourth node N4 is at a high potential and the first reference voltage terminal Vref1 is at a low potential, the second capacitor C2 is charged. Since the fourth node N4 is at a high potential, the ninth transistor M9 is turned on. The low potential voltage from the first reference voltage terminal Vref1 is transferred to the output terminal OUT through the ninth transistor M9, rendering the output terminal OUT at a low potential.

In phase T3, IN=0, CK=1, and CB=0.

Since CK=1, the first transistor M1 and the fifth transistor M5 are turned on, the first node N1 is at a low potential, and the second transistor M2 is turned off. Since the second reference voltage terminal Vref2 is at a high potential and the fifth transistor M5 is turned on, the second node N2 is maintained at a high potential so that the sixth transistor M6 and the third transistor M3 are turned on, and the third node N3 is at a low potential. Since the second node N2 is at a high potential and the third node N3 is at a low potential, the first capacitor C1 is charged. With CB=0, the fourth transistor M4 and the seventh transistor M7 are turned off. Since the first node N1 is at a low potential, the tenth transistor M10 and the eighth transistor M8 are turned off, and the fourth node N4 is in a floating state. Due to the holding effect of the second capacitor C2, the fourth node N4 remains at a high potential as in phase T3, and the ninth transistor M9 is turned on. The low potential voltage from the first reference voltage terminal Vref1 is transferred to the output terminal OUT through the ninth transistor M9, rendering the output terminal OUT still at a low potential.

In phase T4, IN=1, CK=, and CB=1.

Since CK=, the first transistor M1 and the fifth transistor M5 are turned off, the second node N2 is still at a high potential, and the sixth transistor M6 is turned on. As CB=1, the third node N3 changes from being at a low potential to being at a high potential. Since the second node N2 is in the floating state, the self-boosting effect of the first capacitor C1 causes the potential of the second node N2 to be pulled higher further, and thus the third transistor M3 remains turned on. Since CB=1, the fourth transistor M4 and the seventh transistor M7 are turned on, and the first node N1 is still at a low potential. Since the first node N1 is at a low potential and CB=1, the third capacitor C3 is charged. Since the first node N1 is at a low potential, the tenth transistor M10 is turned off. As the seventh transistor M7 is turned on, the fourth node N4 becomes at a high potential, and the ninth transistor M9 is turned on. Since the fourth node N4 is at a high potential and the first reference voltage terminal Vref1 is at a low potential, the second capacitor C2 is charged. The low potential voltage from the first reference voltage terminal Vref1 is transferred to the output terminal OUT through the ninth transistor M9, rendering the output terminal OUT still at a low potential.

In phase T5, IN=1, CK=1, and CB=0.

Since CK=1, the first transistor M1 and the fifth transistor M5 are turned on, the first node N1 becomes at a high potential, and the second transistor M2 is turned on.

The second node N2 is at a high potential, the sixth transistor M6 and the third transistor M3 are turned on, and the third node N3 is at a low potential. Since the third node N3 is at a low potential and the second node N2 is at a high potential, the first capacitor C1 is charged. Since CB=0 and the first node N1 is at a high potential, the third capacitor C3 is charged. With CB=, the fourth transistor M4 and the seventh transistor M7 are turned off. Since the first node N1 is at a high potential, the tenth transistor M10 and the eighth transistor M8 are turned on. The fourth node N4 is at a low potential, and the ninth transistor M9 is turned off. The high potential voltage from the third reference voltage terminal Vref3 is transferred to the output terminal OUT through the tenth transistor M10, making the output terminal OUT become at a high potential.

In phase T6, IN=1, CK=, and CB=1.

Since CK=, the first transistor M1 and the fifth transistor M5 are turned off, the first node N1 is still at a high potential, and the second transistor M2 is turned on. The second node N2 becomes at a low potential, the third transistor M3 and the sixth transistor M6 are turned off, and the first node N1 is in a floating state. Since the second clock signal terminal CB is changed from being at the low potential in phase T5 to being at a high potential, the self-boosting effect of the third capacitor C3 causes the potential of the first node N1 to be further pulled high, and thus the eighth transistor M8 and the tenth transistor M10 are turned on. The fourth node N4 is at a low potential, and the ninth transistor M9 is turned off. Since CB=1, the fourth transistor M4 and the seventh transistor M7 are turned on, and the third node N3 is still at a low potential. The high potential voltage from the third reference voltage terminal Vref3 is transferred to the output terminal OUT through the tenth transistor M10, rendering the output terminal OUT still at a high potential.

The operation of phase T5 and phase T6 is thereafter repeated until the next input signal (a low active pulse) is applied to the input terminal IN.

Figure 5B:
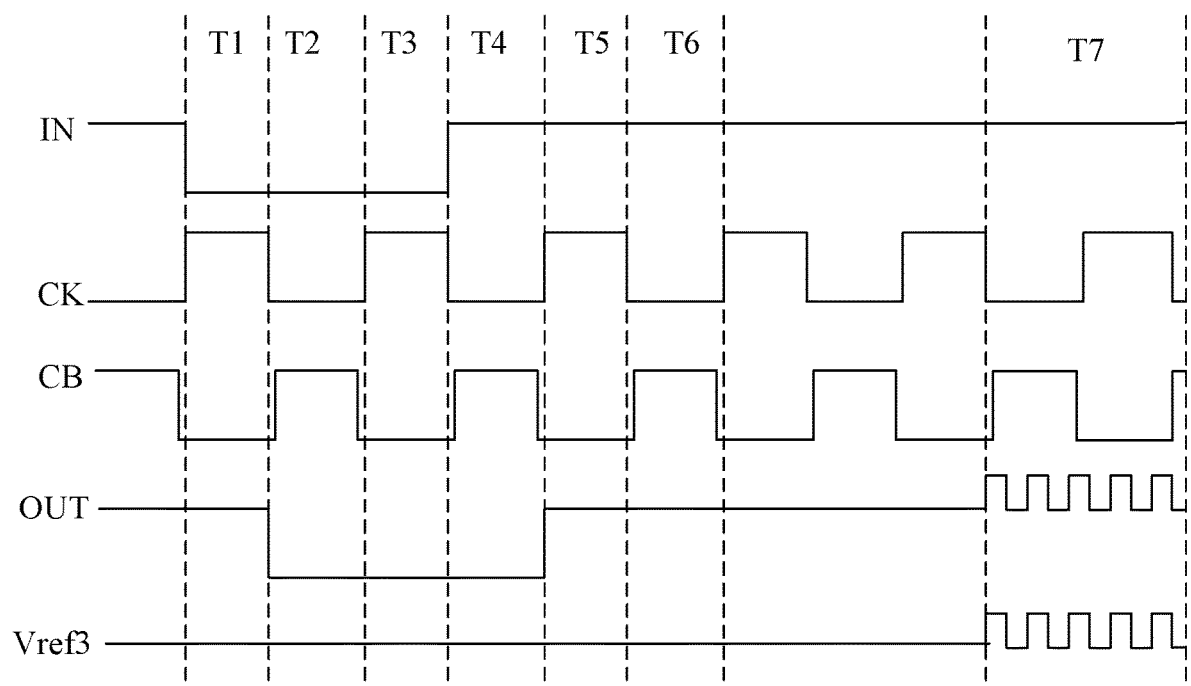
FIG. 5B is an example timing diagram for the shift register unit shown in FIG. 3 in a touch screen scenario.

FIG. 5B is an example timing diagram for the shift register unit 100B shown in FIG. 3 in a touch screen scenario. The touch screen alternately operates in a display phase and a touch sensing phase, and the shift register unit 100B can supply a gate scan signal for pixel circuits in the touch screen. In the display phase (e.g., phases T1-T6), the third reference voltage terminal Vref3 is applied with a DC voltage (a high potential voltage in this example). In the touch sensing phase (phase T7), the third reference voltage terminal Vref3 is additionally applied with a touch scan signal (a square wave signal in this example). The signal from the third reference voltage terminal Vref3 (i.e., a superimposition of the high potential voltage and the touch scan signal) is transferred to the output terminal OUT through the tenth transistor M10 so that the gate scan signal supplied to the pixel circuits is also superposed with the touch scan signal.

Figure 6:
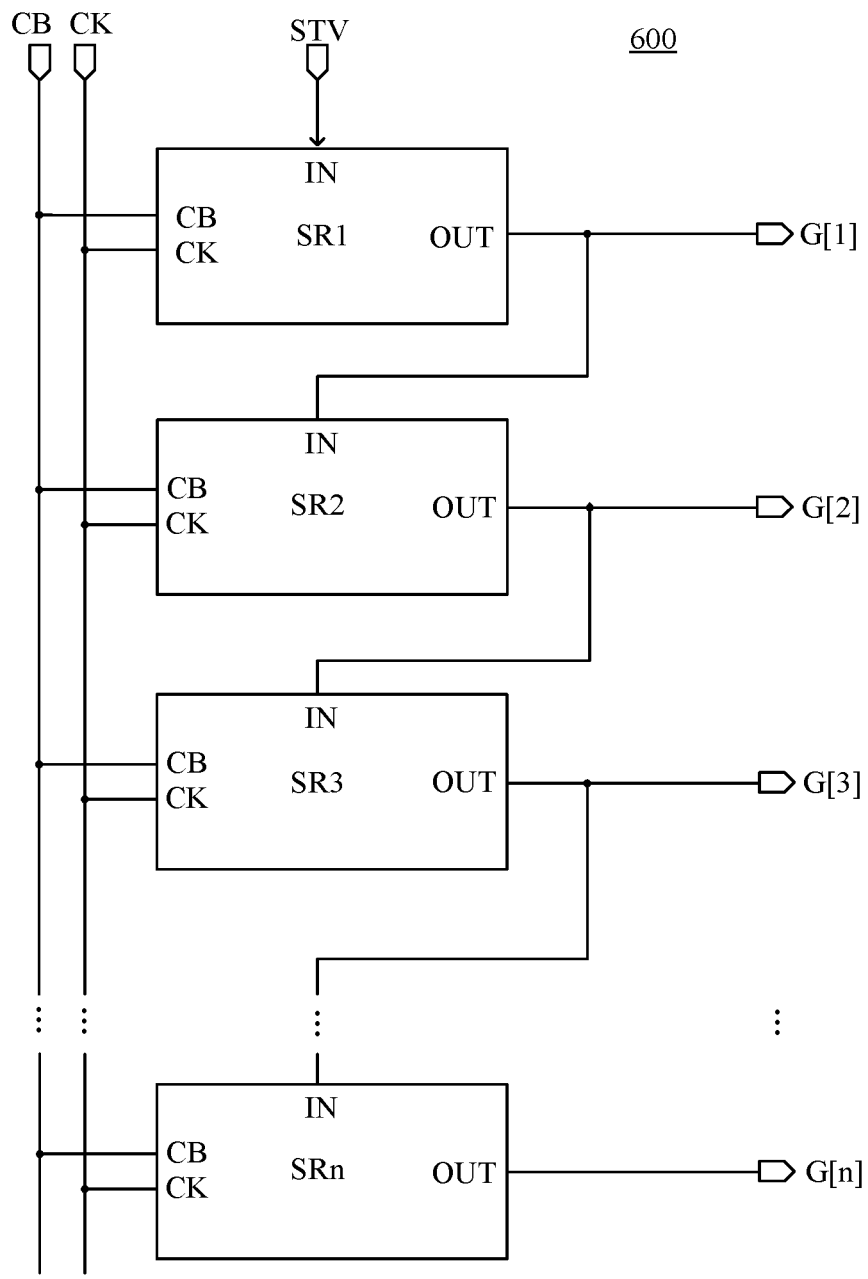
FIG. 6 is a block diagram of a scan driving circuit according to an embodiment of the present disclosure.

FIG. 6 is a block diagram of a scan driving circuit 600 according to an embodiment of the present disclosure. As shown in FIG. 6, the scan driving circuit 600 includes a plurality of cascaded shift register units SR1, SR2, SR3, . . . , SRn, each of which may be the shift register unit 100 as described above with respect to FIGS. 1-3.

The input terminal IN of the first shift register SR1 receives a start pulse STV. Except for the first shift register SR1, the input terminal IN of each shift register is connected to the output terminal OUT of an adjacent preceding shift register. The shift register units SR1, SR2, SR3, . . . , SRn sequentially supply the scan signals to the respective scan lines G[1], G[2], G[3], . . . , G[n].

Figure 7:
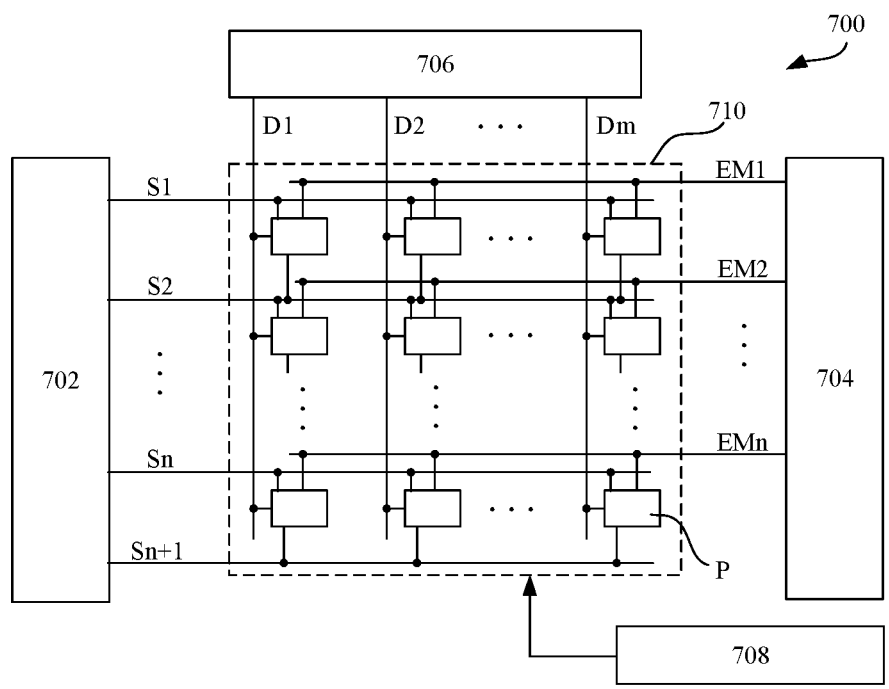
FIG. 7 is a block diagram of a display panel according to an embodiment of the present disclosure.

FIG. 7 is a block diagram of a display panel 700 according to an embodiment of the present disclosure. Referring to FIG. 7, the display panel 700 includes a pixel array 710 including n×m pixels P. Herein, the display panel 700 may be an organic electroluminescent display panel (e.g., an organic light emitting diode (OLED) display panel) or a liquid crystal display panel.

In the case of an OLED display panel, each pixel P includes an OLED. As shown in FIG. 7, the pixel array 710 is connected to n+1 scan lines S1, S2, . . . , Sn, Sn+1 arranged in a first direction (a row direction in the figure) to transfer scan signals, m data lines D1, D2, . . . , Dm arranged in a second direction (a column direction in the figure) intersecting with the first direction to transfer data signals, n light emission control lines EM1, EM2, . . . , EMn arranged in the first direction to transfer light emitting control signals, and m first wires (not shown) and m second wires (not shown) for applying the first and second power supply voltages ELVDD and ELVSS. n and m are natural numbers.

In the case of a liquid crystal display panel, the pixel array 710 is connected to n gate lines S1, S2, . . . , Sn and m data lines D1, D2, . . . , Dm. Each pixel P may include a switch element (e.g., a thin film transistor), a liquid crystal capacitor, and a storage capacitor. The liquid crystal capacitor and the storage capacitor are electrically connected to the switch element. The liquid crystal capacitor may include a first electrode connected to a pixel electrode and a second electrode connected to a common electrode. A data voltage can be applied to the first electrode of the liquid crystal capacitor. A common voltage may be applied to the second electrode of the liquid crystal capacitor. The storage capacitor may include a first electrode connected to the pixel electrode and a second electrode connected to the storage electrode. The data voltage can be applied to the first electrode of a storage capacitor. A storage voltage may be applied to the second electrode of the storage capacitor. The storage voltage may be substantially equal to the common voltage.

In the example of FIG. 7, the display panel 700 further includes a first scan driver 702, a second scan driver 704, a data driver 706, and a power supply 708.

The first scan driver 702 is connected to the scan lines S1, S2, . . . , Sn, Sn+1 to apply the scan signals to the pixel array 710. The first scan driver 702 may be the scan driver 600 as described above with respect to FIG. 6.

The second scan driver 704 is connected to the light emission control lines EM1, EM2, . . . , EMn to apply the light emission control signals to the pixel array 710. The second scan driver 704 may be the scan driver 600 as described above with respect to FIG. 6.

The data driver 706 is connected to the data lines D1, D2, . . . , Dm to apply data signals to the pixel array 710. Here, the data driver 706 supplies the data signals to the pixel circuits P in the pixel array 710 during data writing.

The power supply 708 applies the first power voltage ELVDD and the second power voltage ELVSS to each of the pixel circuits P in the pixel array 710.

The first scan driver 702, the second scan driver 704, the data driver 706, and the power supply 708 may not be necessary for the display panel 700. For example, the display panel 700 may include only the pixel array 710. For another example, the display panel 700 may include (integrate thereon) only the first scan driver 702 and the second scan driver 704 without the data driver 706. For yet another example, in the case of a liquid crystal display panel, the display panel 700 may include (integrate thereon) only the first scan driver 702 without the second scan driver 704.

The display panel 700 may be a self-capacitive touch screen. In the case of an OLED display panel, the cathode layer of the OLED devices may be patterned to form a plurality of individual touch electrodes. Alternatively, in the case of a liquid crystal display panel, the common electrode layer may be patterned to form a plurality of individual touch electrodes.

Examples of the display panel 700 include, but are not limited to, a product or component having a display function such as a mobile phone, a tablet computer, a television set, a monitor, a notebook computer, a digital photo frame, a navigator, and the like.

Figure 8A:
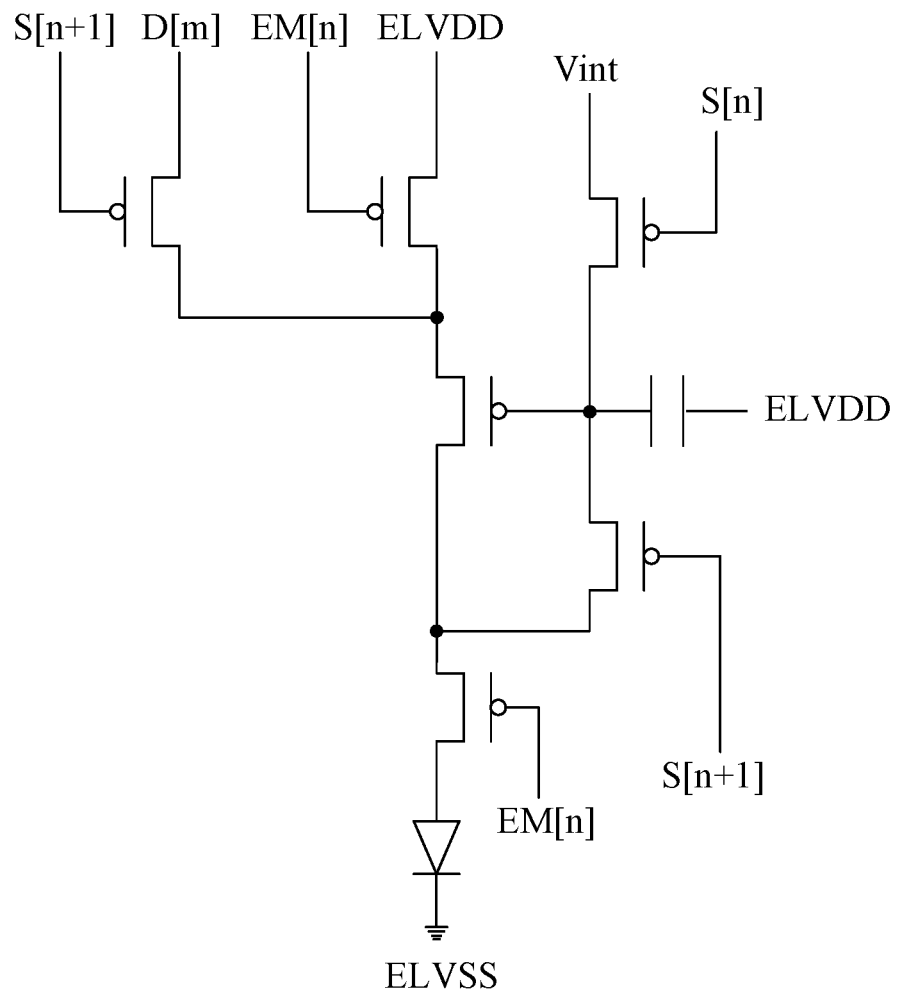
FIG. 8A is a circuit diagram of an example pixel circuit in the display panel shown in FIG. 7.
Figure 8B:
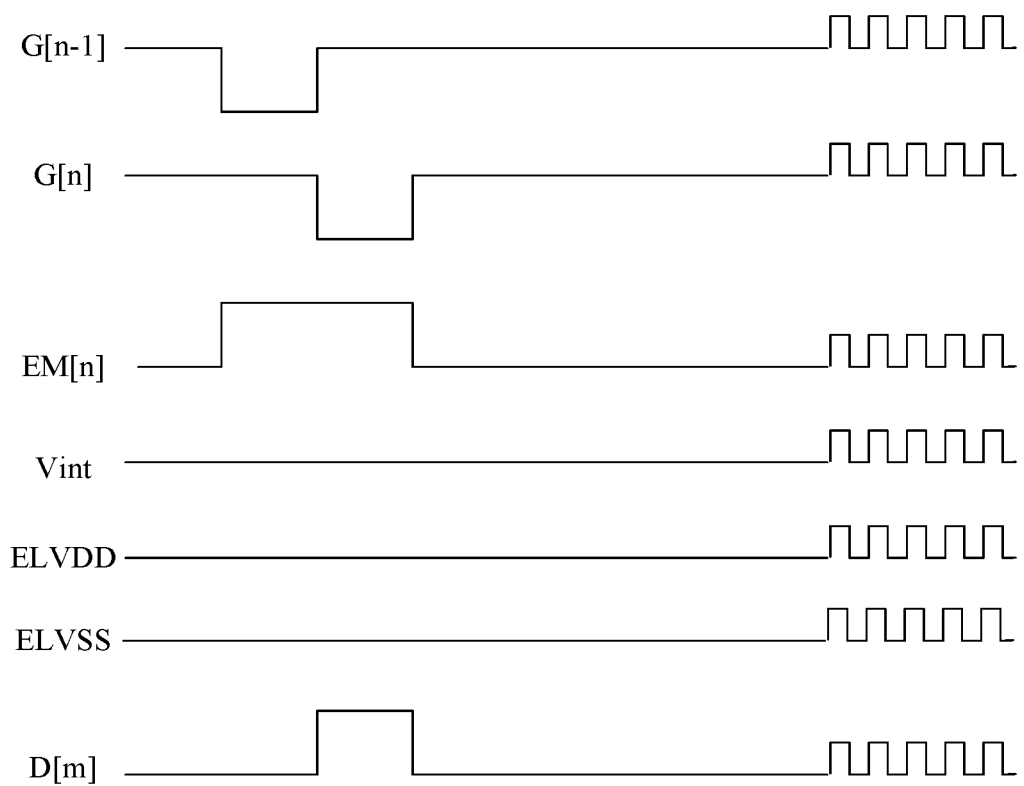
FIG. 8B is an example timing diagram for the example pixel circuit shown in FIG. 8A.

FIG. 8A is a circuit diagram of an example pixel circuit in the display panel 700 shown in FIG. 7, and FIG. 8B is an example timing diagram for the example pixel circuit shown in FIG. 8A.

This example pixel circuit is an OLED pixel circuit connected to scan lines S[n] and S[n+1], a light emission control line EM[n], a data line D[m], an initial voltage terminal Vint, and the power supply wires ELVDD and ELVSS, as shown in FIG. 8A.

As shown in FIG. 8B, during a touch sensing phase, each of the terminals of the pixel circuit is additionally applied with a touch scan signal represented by a square wave. The scan signals on the scan lines S[n] and S[n+1] are supplied by the first scan driver 702 shown in FIG. 7, and the light emission control signal on the light emission control line EM[n] is supplied by the second scan driver 704 shown in FIG. 7. In order not to obscure the subject matter of the present disclosure, a detailed description of the operation of the pixel circuit is omitted here.

It will be apparent to those skilled in the art that various modifications and variations can be made to the present disclosure without departing from the spirit and scope of the disclosure. Thus, if these modifications and variations of the present disclosure fall within the scope of the appended claims and equivalents thereof, the present disclosure also intends to encompass these modifications and variations.

What is claimed is:

1. A shift register unit comprising:
    an input circuit configured to transfer an input signal from an input terminal to a first node in response to a first clock signal from a first clock signal terminal being active;
    a first control circuit configured to transfer a first reference voltage from a first reference voltage terminal to the first node in response to a second node being at an active potential and a second clock signal from a second clock signal terminal being active, and to transfer the first clock signal from the first clock signal terminal to the second node in response to the first node being at an active potential;
    a second control circuit configured to transfer a second reference voltage from a second reference voltage terminal to the second node in response to the first clock signal from the first clock signal terminal being active, and to transfer the second clock signal from the second clock signal terminal to a third node in response to the second node being at an active potential;
    a third control circuit configured to bring the third node into conduction with a fourth node in response to the second clock signal from the second clock signal terminal being active, and to transfer the first reference voltage from the first reference voltage terminal to the fourth node in response to the first node being at an active potential;
    a first output circuit configured to transfer the first reference voltage from the first reference voltage terminal to an output terminal in response to the fourth node being at an active potential; and
    a second output circuit configured to transfer a third reference voltage from a third reference voltage terminal to the output terminal in response to the first node being at an active potential.

2. The shift register unit of claim 1, wherein the input circuit comprises a first transistor having a gate connected to the first clock signal terminal, a first electrode of the first transistor connected to the input terminal, and a second electrode of the first transistor connected to the first node.

3. The shift register unit of claim 1, wherein the first control circuit comprises:
    a second transistor having a gate connected to the first node, a first electrode of the second transistor connected to the first clock signal terminal, and a second electrode of the second transistor connected to the second node;
    a third transistor having a gate connected to the second node, a first electrode of the third transistor connected to the first reference voltage terminal, and a second electrode of the third transistor; and
    a fourth transistor having a gate connected to the second clock signal terminal, a first electrode of the fourth transistor connected to the second electrode of the third transistor, and a second electrode of the fourth transistor connected to the first node.

4. The shift register unit of claim 1, wherein the second control circuit comprises:
    a fifth transistor having a gate connected to the first clock signal terminal, a first electrode of the fifth transistor connected to the second reference voltage terminal, and a second electrode of the fifth transistor connected to the second node;
    a sixth transistor having a gate connected to the second node, a first electrode of the sixth transistor connected to the second clock signal terminal, and a second electrode of the sixth transistor connected to the third node; and
    a first capacitor connected between the second node and the third node.

5. The shift register unit of claim 1, wherein the third control circuit comprises:
    a seventh transistor having a gate connected to the second clock signal terminal, a first electrode of the seventh transistor connected to the third node, and a second electrode of the seventh transistor connected to the fourth node; and
    an eighth transistor having a gate connected to the first node, a first electrode of the eighth transistor connected to the first reference voltage terminal, and a second electrode of the eighth transistor connected to the fourth node.

6. The shift register unit of claim 1, wherein the first output circuit comprises:
    a ninth transistor having a gate connected to the fourth node, a first electrode of the ninth transistor connected to the first reference voltage terminal, and a second electrode of the ninth transistor connected to the output terminal of the shift register unit; and
    a second capacitor connected between the fourth node and the first reference voltage terminal.

7. The shift register unit of claim 1, wherein the second output circuit comprises:
    a tenth transistor having a gate connected to the first node, a first electrode of the tenth transistor connected to the third reference voltage terminal, and a second electrode of the tenth transistor connected to the output terminal of the shift register unit; and
    a third capacitor connected between the first node and the second clock signal terminal.

8. The shift register unit of claim 1, wherein the third reference voltage terminal and the second reference voltage terminal are a same signal terminal.

9. A scan driving circuit comprising a plurality of shift register units as claimed in claim 1 in a cascaded configuration, wherein except for a first one of the plurality of shift register units, the input terminal of each of the plurality of shift registers is connected to the output terminal of an adjacent preceding one of the shift register units.

10. A display panel comprising the scan driving circuit as claimed in claim 9.

11. The display panel of claim 10, wherein the display panel is a self-capacitive touch screen configured to alternately operate in a display phase and a touch sensing phase, and wherein the third reference voltage terminal of each of the plurality of shift register units of the scan driving circuit is configured to receive a direct current voltage as the third reference voltage during the display phase and receive a superposition of the direct current voltage and a touch scan signal for touch electrodes of the self-capacitive touch screen during the touch sensing phase.

12. The scan driving circuit of claim 9, wherein the input circuit comprises a first transistor having a gate connected to the first clock signal terminal, a first electrode connected to the input terminal, and a second electrode connected to the first node.

13. The scan driving circuit of claim 9, wherein the first control circuit comprises:
a second transistor having a gate connected to the first node, a first electrode of the second transistor connected to the first clock signal terminal, and a second electrode of the second transistor connected to the second node;
a third transistor having a gate connected to the second node, a first electrode of the third transistor connected to the first reference voltage terminal, and a second electrode of the third transistor; and
a fourth transistor having a gate connected to the second clock signal terminal, a first electrode of the fourth transistor connected to the second electrode of the third transistor, and a second electrode of the fourth transistor connected to the first node.

14. The scan driving circuit of claim 9, wherein the second control circuit comprises:
a fifth transistor having a gate connected to the first clock signal terminal, a first electrode of the fifth transistor connected to the second reference voltage terminal, and a second electrode of the fifth transistor connected to the second node;
a sixth transistor having a gate connected to the second node, a first electrode of the sixth transistor connected to the second clock signal terminal, and a second electrode of the sixth transistor connected to the third node; and
a first capacitor connected between the second node and the third node.

15. The scan driving circuit of claim 9, wherein the third control circuit comprises:
a seventh transistor having a gate connected to the second clock signal terminal, a first electrode of the seventh transistor connected to the third node, and a second electrode of the seventh transistor connected to the fourth node; and
an eighth transistor having a gate connected to the first node, a first electrode of the eighth transistor connected to the first reference voltage terminal, and a second electrode of the eighth transistor connected to the fourth node.

16. The scan driving circuit of claim 9, wherein the first output circuit comprises: a ninth transistor having a gate connected to the fourth node, a first electrode of the ninth transistor connected to the first reference voltage terminal, and a second electrode of the ninth transistor connected to the output terminal of the shift register unit; and
a second capacitor connected between the fourth node and the first reference voltage terminal.

17. The scan driving circuit of claim 9, wherein the second output circuit comprises:
a tenth transistor having a gate connected to the first node, a first electrode of the tenth transistor connected to the third reference voltage terminal, and a second electrode of the tenth transistor connected to the output terminal of the shift register unit; and
a third capacitor connected between the first node and the second clock signal terminal.

18. A method of driving a shift register unit, the shift register unit being for use by a self-capacitive touch screen, the self-capacitive touch screen being configured to alternately operate in a display phase and a touch sensing phase, the shift register unit comprising: an input circuit configured to transfer an input signal from an input terminal to a first node in response to a first clock signal from a first clock signal terminal being active; a first control circuit configured to transfer a first reference voltage from a first reference voltage terminal to the first node in response to a second node being at an active potential and a second clock signal from a second clock signal terminal being active, and to transfer the first clock signal from the first clock signal terminal to the second node in response to the first node being at an active potential; a second control circuit configured to transfer a second reference voltage from a second reference voltage terminal to the second node in response to the first clock signal from the first clock signal terminal being active, and to transfer the second clock signal from the second clock signal terminal to a third node in response to the second node being at an active potential; a third control circuit configured to bring the third node into conduction with a fourth node in response to the second clock signal from the second clock signal terminal being active, and to transfer the first reference voltage from the first reference voltage terminal to the fourth node in response to the first node being at an active potential; a first output circuit configured to transfer the first reference voltage from the first reference voltage terminal to an output terminal in response to the fourth node being at an active potential; and a second output circuit configured to transfer a third reference voltage from a third reference voltage terminal to the output terminal in response to the first node being at an active potential, the method comprising:
in the display phase, selectively transferring, by the first and second output circuits, the first reference voltage from the first reference voltage terminal and the third reference voltage from the third reference voltage terminal to the output terminal, depending on potentials of the first node and the fourth node; and
in the touch sensing phase, transferring, by the second output circuit, the third reference voltage from the third reference voltage terminal to the output terminal.

19. The method of claim 18, wherein in the display phase the third reference voltage is a direct current voltage.

20. The method of claim 19, wherein in the touch sensing phase the third reference voltage is a superposition of the direct current voltage and a touch scan signal for touch electrodes of the self-capacitive touch screen.

* * * * *